(12) United States Patent
Willardson

(10) Patent No.: US 6,732,228 B1
(45) Date of Patent: May 4, 2004

(54) MULTI-PROTOCOL DATA CLASSIFICATION USING ON-CHIP CAM

(75) Inventor: Richard Willardson, Portland, OR (US)

(73) Assignee: Network Elements, Inc., Beaverton, OR (US)

( * ) Notice: Subject to any disclaimer, the term of this patent is extended or adjusted under 35 U.S.C. 154(b) by 60 days.

(21) Appl. No.: 09/910,119

(22) Filed: Jul. 19, 2001

(51) Int. Cl.[7] .................................................. G06F 7/02
(52) U.S. Cl. ........................................... 711/108; 707/6
(58) Field of Search .............................. 711/108; 707/6; 370/392, 389

(56) References Cited

U.S. PATENT DOCUMENTS

| | | | | |
|---|---|---|---|---|
| 5,805,855 A | * | 9/1998 | Liu ............................. | 711/108 |
| 5,842,040 A | * | 11/1998 | Hughes et al. ................ | 710/11 |
| 6,181,699 B1 | * | 1/2001 | Crinion et al. ............... | 370/392 |
| 6,289,414 B1 | * | 9/2001 | Feldmeier et al. ........... | 711/108 |
| 6,374,326 B1 | * | 4/2002 | Kansal et al. ................ | 711/108 |
| 6,467,019 B1 | * | 10/2002 | Washburn .................... | 711/108 |
| 6,484,170 B2 | * | 11/2002 | Abdat .......................... | 707/6 |
| 6,633,567 B1 | * | 10/2003 | Brown ...................... | 370/395.3 |
| 2002/0126672 A1 | * | 9/2002 | Chow et al. ................. | 370/392 |
| 2002/0163909 A1 | * | 11/2002 | Sarkinen et al. ............. | 370/386 |

* cited by examiner

*Primary Examiner*—Mano Padmanabhan
*Assistant Examiner*—Jasmine Song
(74) *Attorney, Agent, or Firm*—Schwabe, Williamson & Wyatt, P.C.

(57) ABSTRACT

An apparatus is equipped with a content addressable memory (CAM) to store one or more key entries corresponding to a data class represented by the CAM. Each of the one or more key entries is associated with a key tag corresponding to one of one or more subclasses of the data class. The apparatus is further equipped with logic coupled to the CAM to extract a data key from a data stream, to compare all or part of the data key with the one or more key entries to determine if the data key is a member of the data class, and to classify the data key as belonging to one of the one or more subclasses of the data class if the data key is determined to be a member of data class.

21 Claims, 7 Drawing Sheets

MULTI-PROTOCOL DATA CLASSIFICATION USING ON-CHIP CAM

BACKGROUND OF THE INVENTION

1. Field of the Invention

The present invention relates to the field of networking. More specifically, the present invention relates to multi-protocol data classification using on-chip content addressable memory (CAM).

2. Background Information

The continued proliferation of digital communication devices, including personal computers, personal digital assistants (PDAs), and cellular- and PCS-based telephones, as well as the proliferation of associated data communications networks such as the Internet, have enabled as well as promoted the global exchange of electronic data. As technological advancements continue to be made in the field of data communications, the volume and complexity of data exchanged locally and globally via communications networks such as the Internet similarly continue to increase. For example, real time audio and video streaming over networks requires very large amounts of bandwidth as well as the utilization of complex encoding and decoding algorithms. Simple network applications such as on-line commerce and electronic mail, on the other hand, generally require only small amounts of bandwidth, but nonetheless encompass a large portion of network data transmissions.

As the volume and complexity of data transmitted throughout the various networks continues to grow, the likelihood of encountering mischievous attacks such as denial of service attacks from unfriendly sources becomes more likely. To thwart such attempts before they occur, devices known as firewalls are often utilized to effectively hide devices sharing a network with the firewall from potentially untrustworthy external sources. In order to differentiate between data communicated from the various trustworthy "internal" sources and the untrustworthy "external" sources, the firewall often inspects the source address of the data packet to determine the identity of the data packet source. The firewall then typically blocks passage of the data into the network from sources deemed untrustworthy, and passes data from sources deemed trustworthy. Although important, these data inspections unfortunately can be time consuming, especially in networks with operating frequencies at and above 10 Gigabit/second.

Furthermore, as the amount of data on the Internet continues to increase, new uses for that data are continually being introduced. For example, with the popularity of Internet based e-commerce, many companies are now requiring individuals to provide personal and/or demographic information before being allowed to complete the requested transaction. In hopes of recouping revenue, many more companies are beginning to collect and ultimately sell web-related statistical information such as user browsing habits, web sites visited, and so forth. In order for this data to prove useful, however, it needs to be classified prior to being analyzed. Given the enormous volumes of such data that is currently in existence classification has proven extremely slow and difficult to accomplish

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well-known features are omitted or simplified in order not to obscure the present invention. Further, the description repeatedly uses the phrase "in one embodiment", which ordinarily does not refer to the same embodiment, although it may.

Overview

Figure 1:
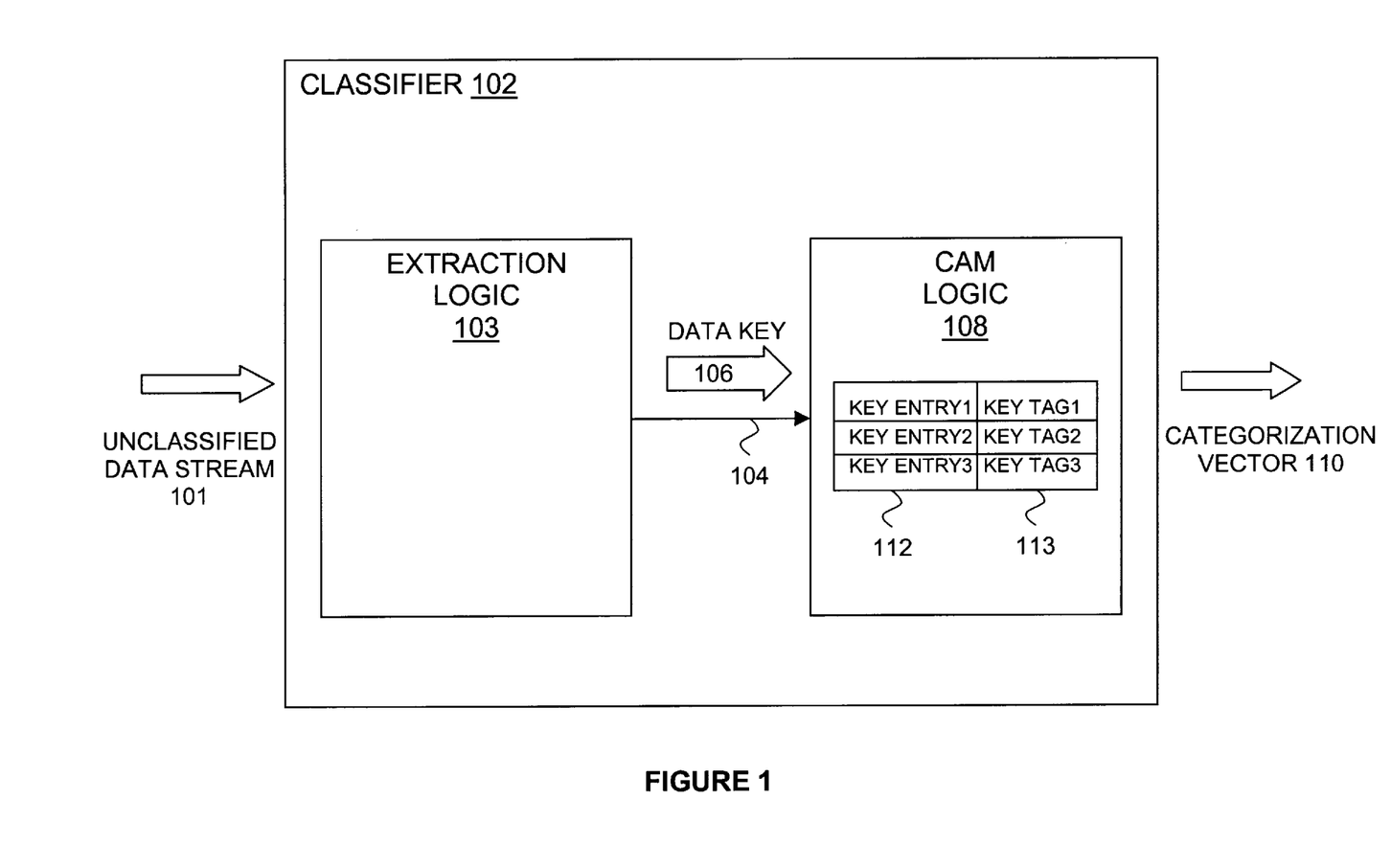
FIG. 1 illustrates an overview of the present invention in accordance with one embodiment.

Referring now to FIG. 1, wherein an overview of the present invention is illustrated. As shown, classifier 102 includes extraction logic 103 and on-chip content addressable memory (CAM) logic 108 coupled together via communication link 104. Extraction logic 103 is equipped to extract one or more data keys, such as data key 106, from a data input stream (101) and compare the extracted data key(s) against data stored within CAM logic 108, such as key entries 112 and associated key tags 113. In one embodiment of the invention, each content addressable memory and each of key entries 112 of CAM logic 108 is associated with a class of data, whereas each of key tags 113 represents a subclass of data. If data key 106 is determined to be equivalent to any of key entries 112 for example, then data key 106 would be classified as belonging to the class(es) of data represented by the matching one(s) of key entries 112 and the subclass(es) of data represented by the corresponding one(s), of key tags 113. The key tag(s) associated with the one or more key entries that are found to be equivalent to data key 106, are output from CAM logic 108 to form at least part of categorization vector 110. Categorization vector 110 may then be used in association with packet filtering logic such as that described with respect to FIG. 6 to filter data packets of unclassified data stream 101 based upon the extracted data keys.

Group Membership

Figure 2A:
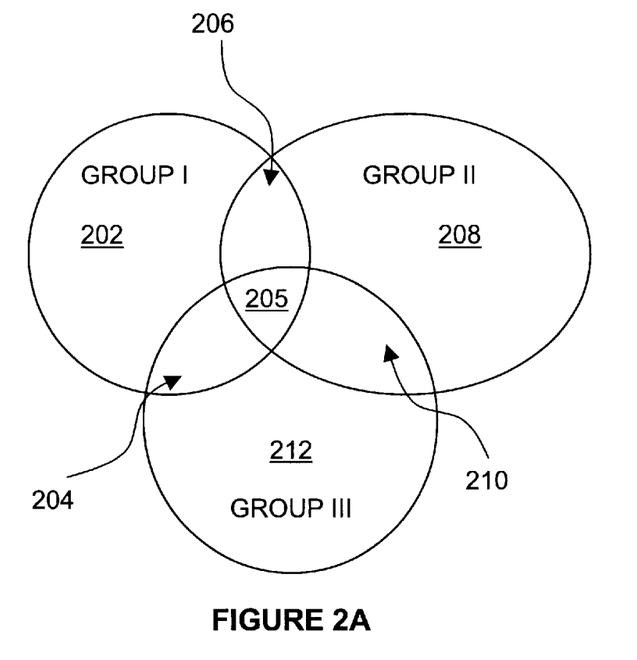
FIGS. 2A and 2B illustrate the concept of group memberships in accordance with one embodiment of the invention.
Figure 2B:
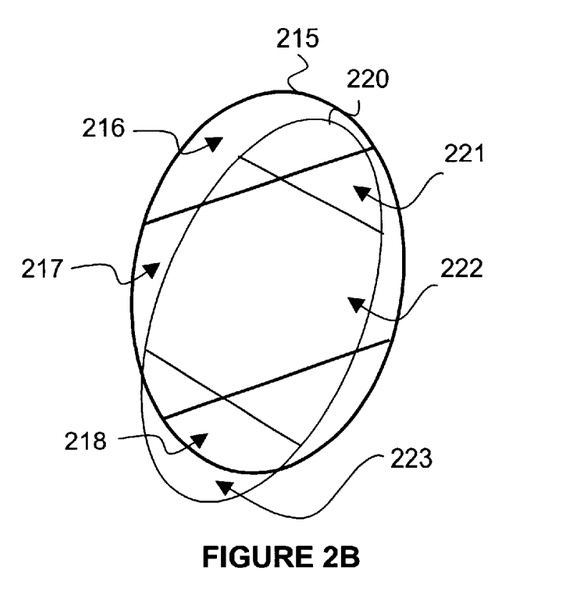

FIGS. 2A and 2B each illustrate the concept of group memberships in accordance with one embodiment of the invention. Referring first to FIG. 2A, three overlapping membership groups (I, II, and II) are shown forming seven labeled membership regions (202, 204, 205, 206, 208, 210, and 212). Region 205, for example, represents the region formed by the intersection of membership Group I, membership Group II, and membership Group III. Likewise, region 204 is formed by the intersection between membership Group I and membership Group III minus region 205, region 206 is formed by the intersection between membership Group I and membership Group II minus region 205, and region 210 is formed by the intersection between membership Group II and membership Group III minus region 205.

In accordance with the teachings of the present invention, membership Groups I, II, and III may represent any number of distinct categories or classes of data types that share common characteristics. For example, in the context of an Ethernet data packet, membership Group I may represent a group of data packets containing source addresses that share one or more common characteristics (e.g., geographic location), whereas membership Group II may represent a group of destination addresses sharing common characteristics, and membership Group III may represent a group of Virtual Local Area Network (VLAN) tags similarly sharing common characteristics.

In one embodiment of the present invention, each of the various membership groups of FIG. 2A represents a unique data class and each of the regions depicted in FIG. 2A represents a data subclass. For example, membership Group I may represent data packets originating from a particular source address or subnet, whereas membership Group II may represent data packets addressed to a particular destination address or subnet. Accordingly, region 206 might then represent those data packets including a source address having the characteristics of membership Group I, while also including a destination address having the characteristics of membership Group II. In fact, in the illustrated example, the only data packets that include characteristics of both membership Group I and membership Group II that would not be represented by region 206 would be those data packets represented by region 205 (e.g., those data packets including the particular source and destination addresses that are members of the VLAN represented by Group III).

In accordance with the teachings of the invention, data memberships such as those shown in FIG. 2A may be reflected by key entries stored within CAM logic 108 of FIG. 1 (to be more fully described below). For example, assume data packets included within Group I represent source addresses that are stored within a first CAM, while data packets included within Group II represent destination addresses that are stored within a second CAM. Likewise, assume data packets included within Group III represent VLAN tags that are stored within a third CAM. Accordingly, data packets represented by region 206 may thus be stored within either one or both of the first and/or second CAMs. In accordance with one embodiment of the invention, the data packets are stored as 64-bit representations within one or more CAMs. In one embodiment, the key entries within each CAM are further divided into subgroups representing subclasses of the data class represented by the associated CAM. In one embodiment of the invention, these subclasses of data are represented by binary key tag strings.

FIG. 2B also illustrates various group memberships in accordance with one embodiment of the invention. FIG. 2B includes a first membership group 215 representing a first class of data, and a second membership group 220 representing a second class of data. For the purposes of explanation, assume group 215 represents a class of data corresponding to income levels of individuals, and group 220 represents a class of data corresponding to occupations of individuals. Through inspection of the data samples shown in FIG. 2B, it can be seen that a certain portion of those occupations included within group 220 are not included within the income levels of group 215. That is, it can be assumed that those occupations not included within group 215 can be said to represent a portion of individuals who are employed but do not get paid a salary, such as volunteers, for example.

Group 215 is further subdivided into subclasses of data represented by regions 216–218, and group 220 is further subdivided into subclasses of data represented by regions 221–223. For example, region 218 might represent a first income range of $0 to $40,000, region 217 might represent a second income range of $40,001 to $100,000, and region 216 might represent a third income range of $100,001 and greater. Likewise, region 223 might represent a first occupation, region 222 might represent a second occupation, and region 221 might represent a third occupation. In one embodiment of the invention, each subclass of data (i.e., represented by the respective regions 216–218 and 220–223 of groups 215 and 220 of FIG. 2B) is stored within a CAM in association with its respective parent data class (i.e. represented by the membership groups themselves). It can be gleaned from FIG. 2B that some people in the highest income range (i.e., region 216) are not encompassed by group 220 and therefore can be said to not be employed. Such a class of people might be representative of those who receive income from an inheritance rather than through employment. The exemplary group memberships shown in FIGS. 2A and 2B are only two simple examples intended for illustrative purposes and should not be viewed as limiting the invention.

In one embodiment of the invention, the various data class and subclass relationships depicted in FIGS. 2A and 2B for example, are stored within one or more CAMs of the present invention. Extraction logic 103 then compares an extracted data key from input data stream 101 (e.g., data key 106), with key entries stored within CAM logic 108 to determine if the data key and key entries are equivalent. In one embodiment of the invention, a data key represents only a portion of a data packet, whereas in other embodiments, the data key may represent the data packet in its entirety. In the example described above with respect to FIG. 2A, a data key could be all or just a portion of a source address, a destination address, a VLAN tag, an Internet Protocol (IP) address and so forth. In one embodiment of the invention, CAM logic 108 includes at least one nybble wide data mask to facilitate partial equivalence matching between the one or more data keys and the key entries. In one embodiment, if a data key is determined to be equivalent to one or more of such key entries, the data key is identified as belonging to the class of data represented by each CAM containing an equivalent key entry. Likewise in one embodiment, if a data key is identified as belonging to one or more such data classes, the data key is further classified as belonging to one of one or more data subclasses associated with each data class. Thus, depending upon the various data class and data subclass assignments stored within the one or more CAMs of the present invention, a wide variety of statistical data may therefore be classified.

Key Extraction

Figure 3A:
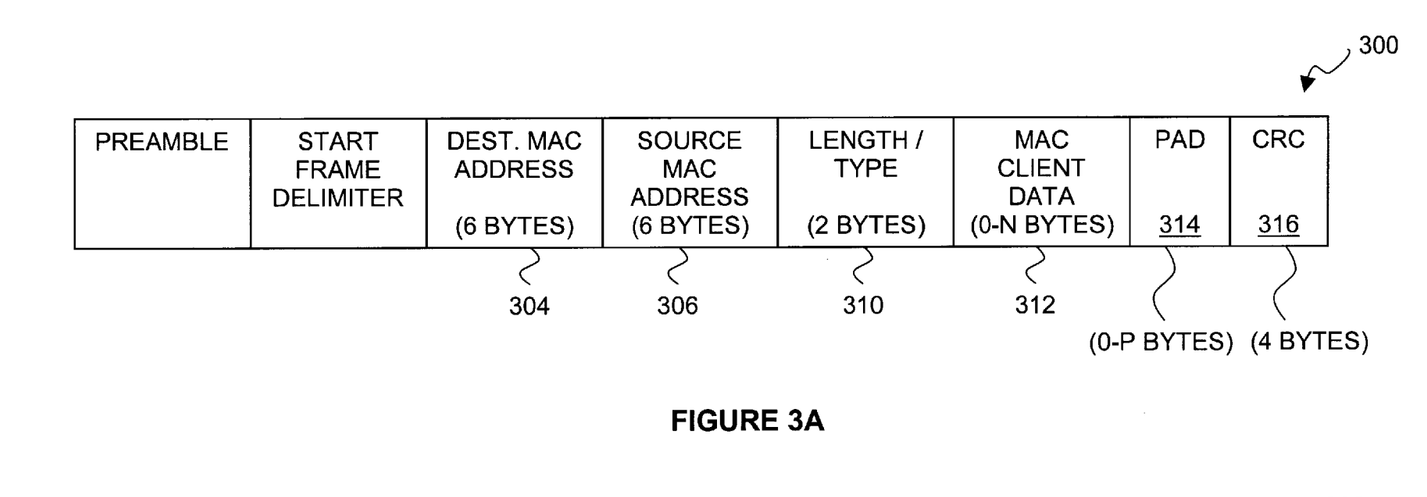
FIGS. 3A and 3B illustrate exemplary Ethernet frame structures suitable for use with the present invention.
Figure 3B:
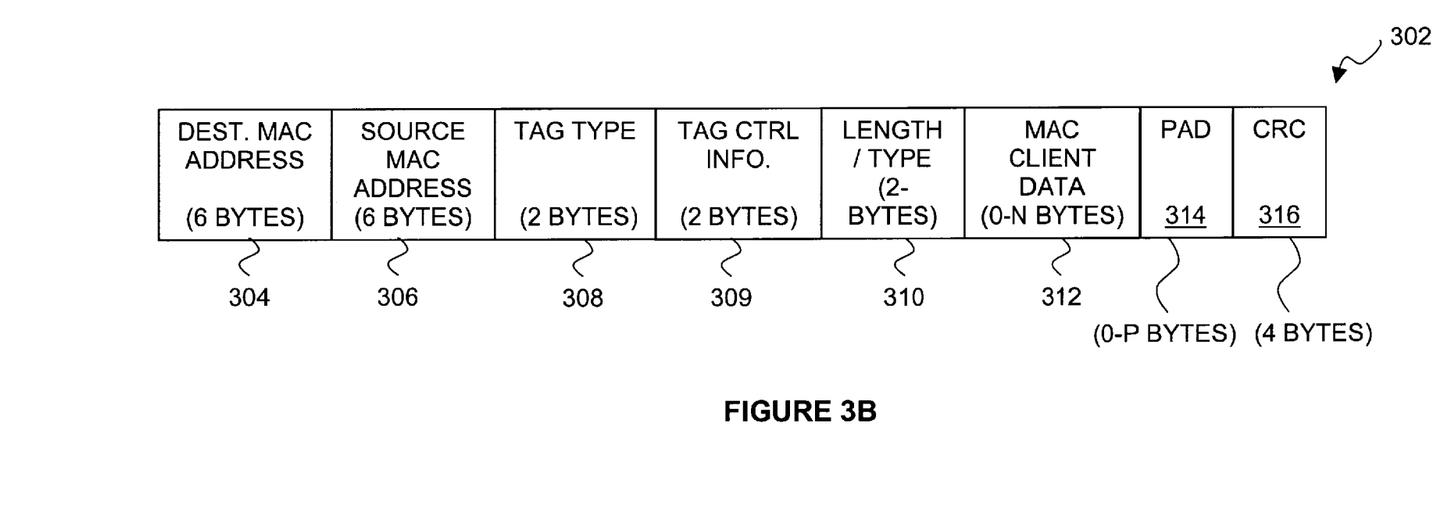

FIGS. 3A and 3B illustrate exemplary Ethernet frame structures suitable for use with the present invention. Referring first to FIG. 3A, frame 300 is shown including a preamble field, a start delimiter field, destination MAC address field 304, source MAC address field 306, length/type field 310, data field 312, pad field 314 and CRC field 316. It should be noted that although the present invention will be described with respect to Ethernet frame packet 300, other network protocols and/or data structures may nonetheless be utilized without departing from the spirit and scope of the invention. Likewise, the use of the terms "frames," and "packets," are used interchangeably and are not intended to denote a particular architecture or protocol.

In frame 300, the preamble and start delimiter fields are used for synchronization between sending and receiving devices. Destination MAC address field 304 identifies the device or devices that are to receive the frame, and source MAC address field 306 identifies the device that originated the frame. Although both destination MAC address field 304 and source MAC address field 306 are each shown as being 6-bytes in length, other variations may also be utilized. For example the Institute of Electrical and Electronic Engineers (IEEE) 802.3 standard provides for source and destination addresses that are 2-bytes in length. If the value of length/type field 310 is less than or equal to 1500, then length/type field 310 indicates the number of bytes in subsequent data field 312. If the value of length/type field 310 is greater than or equal to 1536 bytes, then length/type field 310 indicates the nature of the MAC client protocol. Data field 312 contains the data transferred from the source device to the destination device or devices. In one embodiment, the size of data field 312 varies between 64 and 1500 bytes. If the size of the data is less than 64 bytes, pad field 314 is utilized to provide extra data to bring the frame length up to its minimum size. Frame 300 and its constituent fields are well known in the art and will not be further described except in relation to the present invention.

Referring now to FIG. 3B, frame 302 is shown in substantially similar form as frame 300. In addition to the fields common between frames 300 and 302, tag type field 308 and tag control information field 309 are further provided in frame 302 to form a VLAN tag. Tag type field 308 and tag control information field 309 are associated with VLAN tagging on Ethernet networks as described in the IEEE 802.3ac standard. The VLAN protocol itself (as provided by the IEEE 802.1Q standard) permits insertion of an identifier or "tag" into an Ethernet frame to identify the VLAN to which the frame belongs. According to the protocol, if the VLAN tag (i.e. fields 308–309) is present in an Ethernet frame, tag type field 308 is set to a fixed value of 0×8100 which indicates the presence of the VLAN tag. In one embodiment of the invention, classifier 102 may determine whether data key 106 is equivalent to a whole or part of a VLAN tag stored within one or more CAMs within CAM logic 108. Similarly, extraction logic 103 may be configured to extract all or part of a VLAN tag from an input data stream for use as data key 106 to be compared against the contents of CAM logic 108. In a further embodiment of the invention, if no VLAN tag is present within an Ethernet frame for example, a fixed value may selectively be provided as part of data key 106 in place of the non-present VLAN tag.

Classifier Logic

In one embodiment of the invention, classifier 102 utilizes multiple CAMs configured in a parallel arrangement to facilitate simultaneous classification of numerous data keys. In one embodiment of the invention, eight CAMs are cooperatively utilized in association with eight extracted data keys. In order to facilitate concurrent extraction of multiple data keys, extraction logic 103 utilizes a number of pointers and registers to track and store packet-related information such as multiple offset values, start of packet (SOP) and end of packet (EOP) indicators, and VLAN tag information for use in association with one or more data packets or frames. In one embodiment of the invention, extraction logic 103 includes a programmable byte offset for determining which packet data to extract. In one embodiment, the programmable byte offset provides for offsets from the SOP indicator ranging from 0 to 16 bytes. In one embodiment, 64-contiguous bits are extracted from the indicated offset point, however any number of bits may be extracted depending upon the implementation and hardware configuration of classifier 102.

Figure 4:
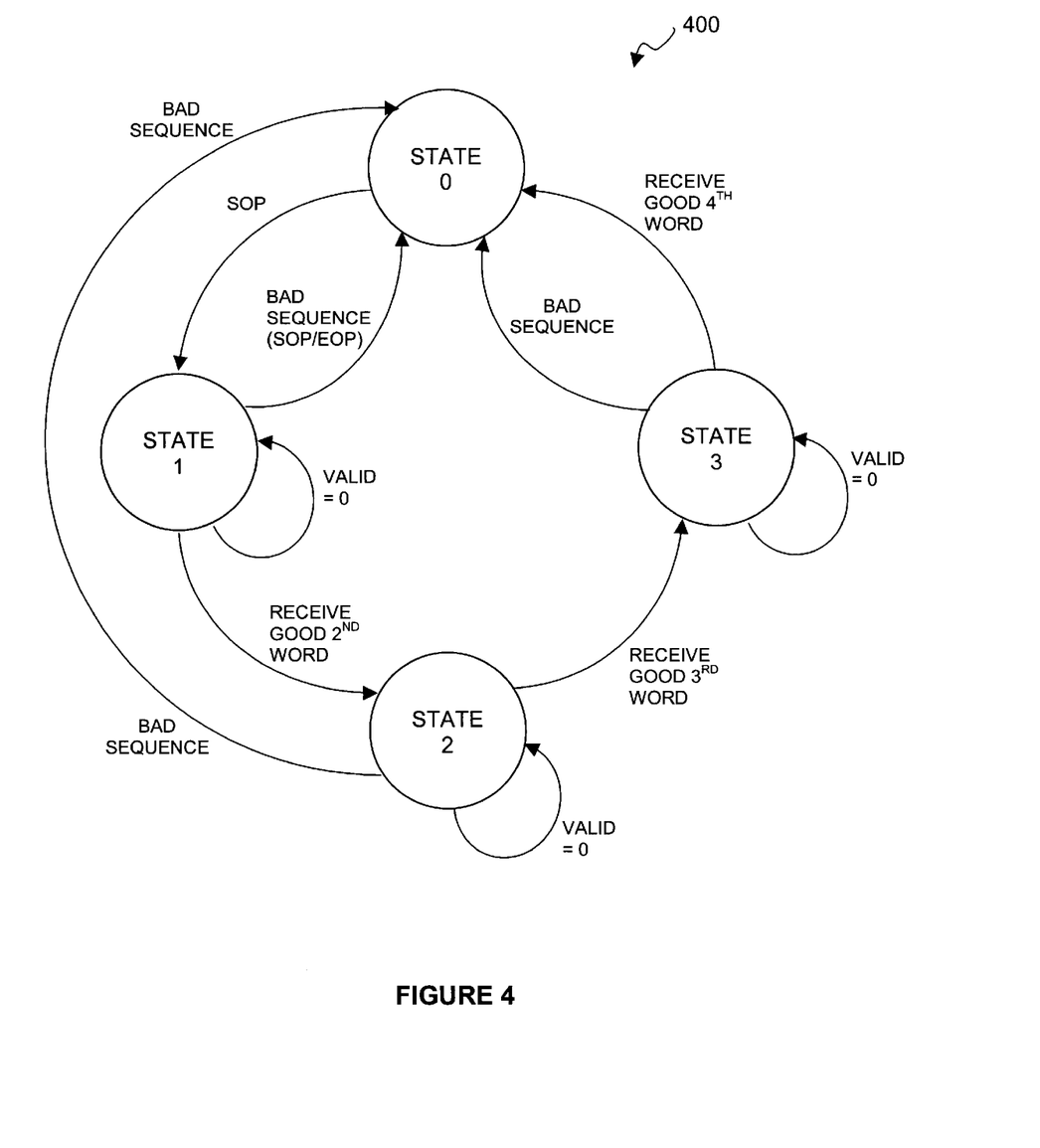
FIG. 4 is a state diagram illustrating operation of one embodiment of extraction logic for use in association with the present invention.

In one embodiment of the invention, four words of data from the incoming data stream are gathered in a gathering register prior to the extraction of the one or more data keys. In one embodiment, a state machine is responsible for determining where the next incoming word is to be written in the gathering register. FIG. 4 is a state diagram illustrating operation of one embodiment of extraction logic suitable for use in association with the extraction of one or more data keys of the present invention. Referring to FIG. 4, state machine 400 is shown having four states (0–3). In the illustrated embodiment, state machine 400 gathers the first four valid)words of a newly received packet (as judged e.g. from the SOP) in a register. Once an SOP is received, it is shifted to the top of the register (i.e., offset=00000) and all other incoming words are offset from that point. Once the four words are gathered, the data keys are extracted. If, however, another SOP is received before all four words are gathered, then this results in an error condition and no data keys are extracted for transmission to CAM logic 108. Rather, a default CAM value (e.g., "00") is issued automatically without accessing the CAMs. Similarly, if an EOP occurs before four words are received, then the default CAM value is also issued automatically without accessing the CAMs. Furthermore, state machine 400 will remain in each state for as long as no valid data is received. Once valid data is detected, state machine 400 progresses to the next state.

As has been previously mentioned, extraction logic 103 is equipped to extract one or more data keys from a data stream based upon a dynamically programmable offset, and compare such data keys with key entries stored within one or more CAMs. In one embodiment, each key entry stored within the one or more CAMs is associated with a corresponding key tag such that when any of the extracted data keys is determined to be equivalent to a key entry in a CAM, the associated key tag corresponding to the key entry is output. If the data key is not equivalent to any key entry in any CAM, a value indicating such (e.g., binary "0") is output. In one embodiment, the key-tags that are output as a result of the comparison are concatenated together to form a categorization vector.

Figure 5:
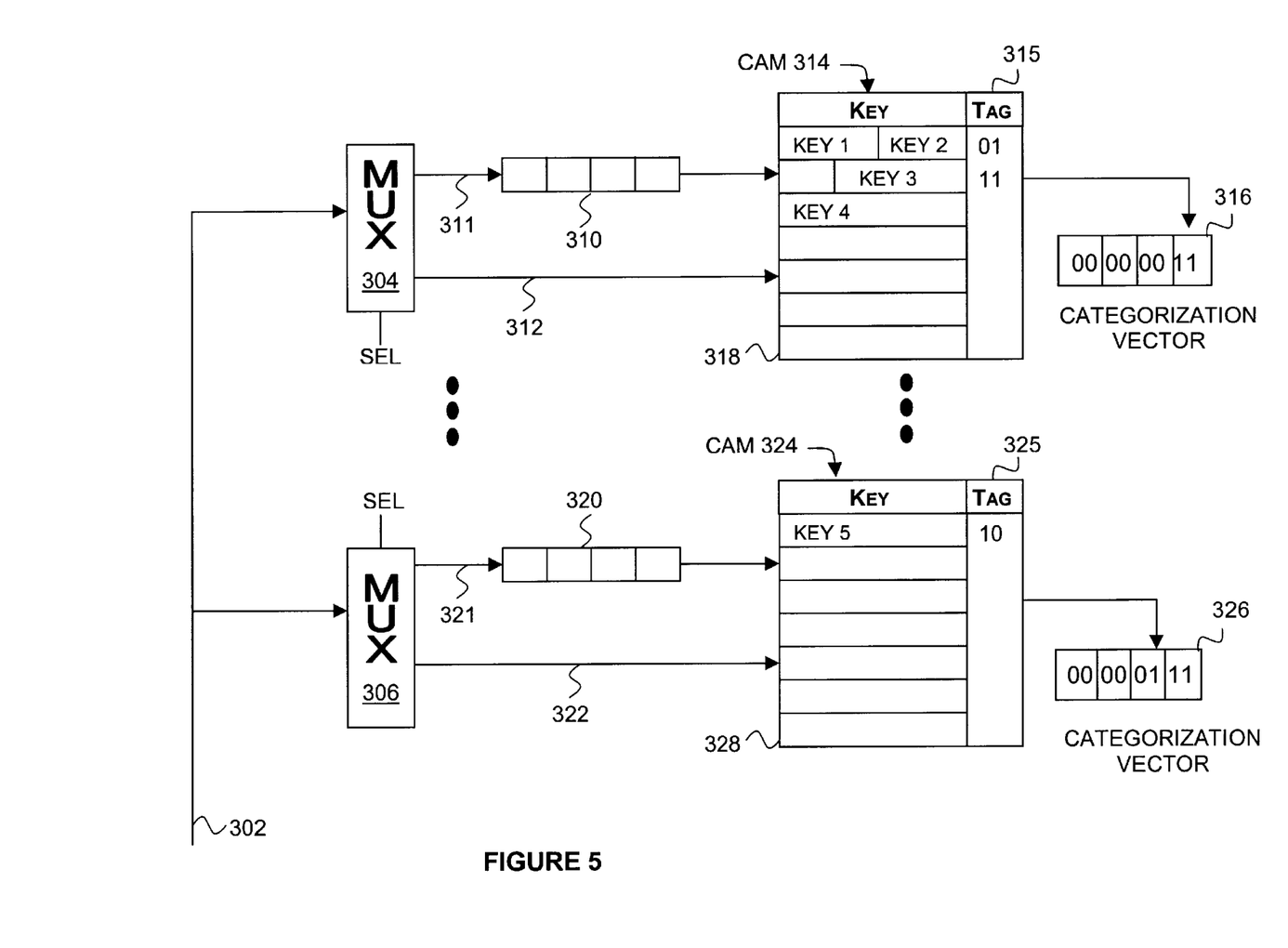
FIG. 5 illustrates one embodiment of classifier of the present invention.

FIG. 5 illustrates a hardware design of classifier 102 in accordance with one embodiment of the invention. Referring to FIG. 5, CAMs 314 and 324 are shown including key entries 1–5 (i.e. key 1 through key 5) in association with corresponding key tags 315 and 325, respectively. In one embodiment each of CAMs 314 and 324 represent a 64×256 Content Addressable Memory to provide 256 64-bit key entries per CAM. In one embodiment, each of CAMs 314 and 324 is coupled to a 2-bit wide SRAM to store key tags 315 and 325, however other customized CAM implementations may similarly be utilized. CAMs 314 and 324 are each coupled to various components including a MUX (304, 306) and a nybble mask (310, 320). More specifically, MUX 304 is coupled to a input signal line 302 and multiple output signal lines 311 and 312. Likewise, MUX 306 is coupled to input signal line 302 and multiple output signal lines 321 and 322. Nybble mask 310 is coupled between MUX 304 and CAM 314, and nybble mask 320 is coupled between MUX 306 and CAM 324.

In accordance with one embodiment of the invention, nybble masks 310 and 320 may be independently programmed to store data to "mask off" at least part of the corresponding data key for comparison against key entries 1–5 stored within CAMs 314 and 324. In one embodiment of the invention, MUXs 304 and 306 may be configured to select or bypass nybble masks 310 and 320 respectively, as deemed appropriate. For example, by selecting signal line 312, MUX 304 may bypass nybble mask 310, and by selecting signal line 322, MUX 306 may bypass nybble mask 320. In an alternative embodiment, MUXs 304 and 306 may operate in association with an n-bit configuration register coupled to the SEL lines of the respective MUXs to function as extraction logic 103. In one embodiment, this can be accomplished by coupling signal line 302 to the above-mentioned gathering register and enabling only select subsets (or the entire set) of bits from the gathering register to pass through MUXs 304 and 306.

If, when compared to the key entries stored within the CAMs, it is determined that go any of the extracted data keys matches a key entry, the corresponding key tag (315, 325) associated with the matched key entry is output to form at least part of categorization vectors 316 and 326.

Sample Application—Packet Filtering

By programming CAMs 314 and 324 (i.e. through a simple software interface), it is possible to define packet filtering rules that will influence which data packets are passed from one network segment to another, which packets are diverted to a host processor or other device for further processing, which packets are dropped from the network based upon group membership principles, and so forth. For example, a network administrator might configure a switching device to allow data originating from a first set of devices from within the organization (i.e. members of a first group) to pass, while blocking other data that originates from one or more devices external to the organization (i.e., members of a second group). In a more complex situation, an administrator may wish to configure the switching device to only pass data transmitted to a particular destination address unless the data originates from a specific source address and is from a particular geographic location. In accordance with the teachings of the present invention, one or more data keys are programmably extracted from each received data packet and compared to one or more key entries in one or more CAMs to create a categorization vector. By performing automatic and programmable combinational logic-based comparisons on the categorization vector, a determination may be made as to the final disposition of each data packet based at least in part upon the previously programmed packet filtering rules.

Figure 6:
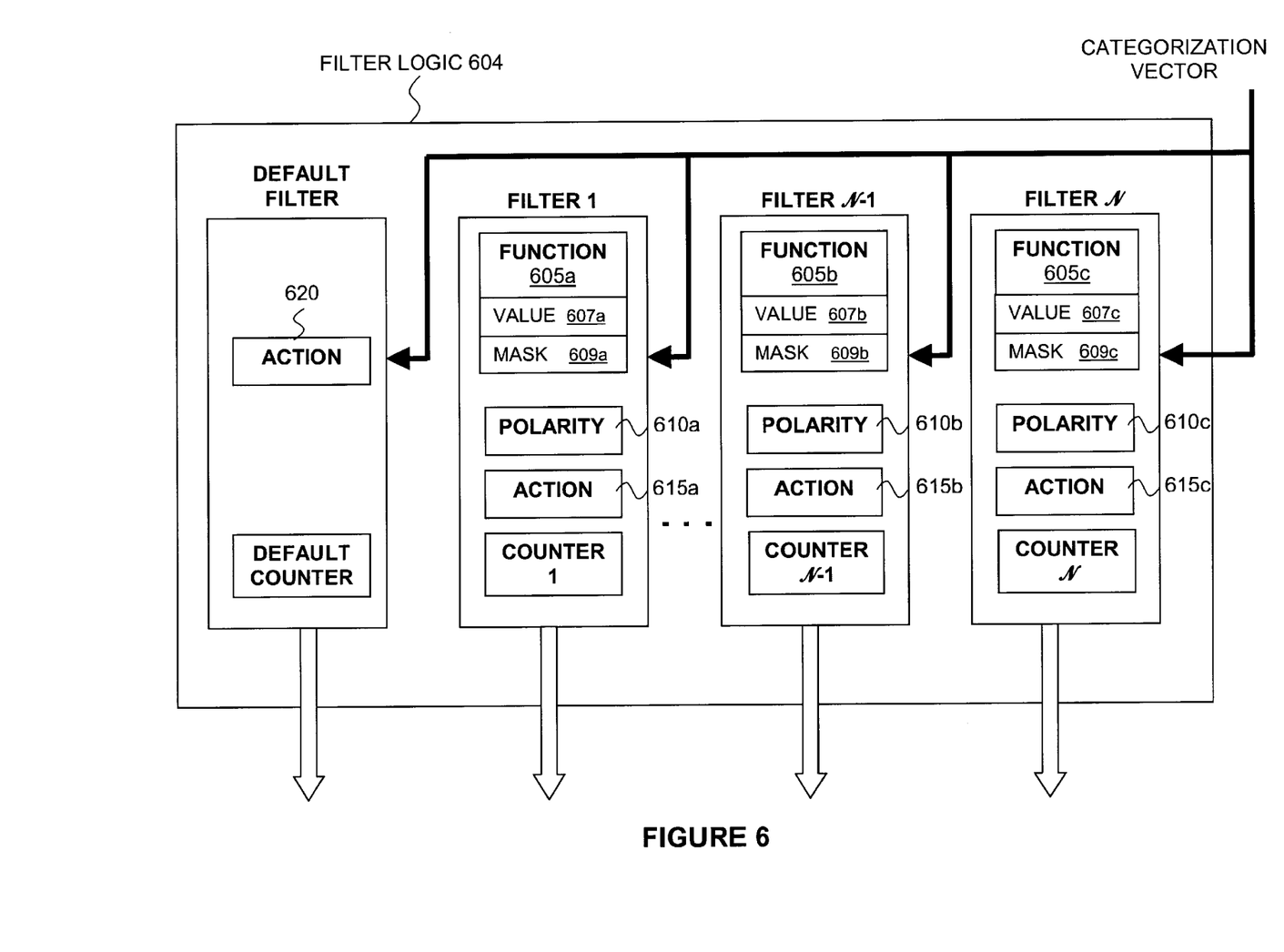
FIG. 6 illustrates one embodiment of filter logic suitable for use in association with present invention.

FIG. 6 illustrates one embodiment of filter logic suitable for use in association at with present invention. Filter logic 604 includes a variable number (N) of packet filters coupled together in a cascaded fashion, and one default filter coupled to the N cascaded packet filters. Each of the packet filters shown in FIG. 6, includes function logic 605, polarity logic 610, and action logic 615. Function logic 605 includes value logic 607 and mask logic 609 to perform comparisons between the categorization vector and one or more data strings stored in value logic 607 and mask logic 609. Action logic 615 specifies an action to be taken with respect to the data packet. For example, action logic 615 may specify whether the data packet should be dropped, passed, or diverted based upon the outcome of one or more logical operations (i.e., comparisons) performed between the categorization vector and data strings specified by value logic 607 and mask logic 609, for example. Polarity logic 610 includes logic to indicate whether the action specified by action logic 615 should be taken based upon a match condition or a miss condition resulting from such comparisons between the categorization vector and the data strings.

In one embodiment of the invention, filters 1 to N are priority encoded such that one filter is given precedence over all other filters in determining the action to be taken with respect to the data packet. In one embodiment, the highest numbered filter is given the highest priority, and the default filter is given the lowest priority. In one embodiment, categorization vector 110 is passed in parallel to all the priority encoded filters (including the default filter), which perform one or more combinational logic based operations on categorization vector 110 to determine the disposition of the data packet. In one embodiment of the invention, function logic 605, further includes independently programmable value logic 607 and independently programmable mask logic 609 to store programmable value data and logic to store programmable mask data respectively. The value data and the mask data are used together to compare expected values (as determined e.g. by a system administrator) against the values represented by categorization vector 110. Each packet filter in which the categorization vector satisfies the specified criteria is then enabled. In one embodiment, the enabled packet filter having the highest relative priority is selected to dispose of the data packet. If the categorization vector does not satisfy the criteria set forth in any of the packet filters, then the default filter unconditionally disposes of the data packet by performing the action programmed within action logic 620. Optionally, any one or more of the priority encoded filters may be disabled such that the disabled filter takes no action with respect to the data packet. In one embodiment, function logic 605 and polarity logic 610 may be dynamically reconfigured while the respective filter is disabled.

Additional information pertaining to programmable packet filtering in association with the above-mentioned filter logic is described in co-pending U.S. patent application, Ser. No. 09/910,116, entitled PROGRAMMABLE PACKET FILTERING IN A PRIORITIZED CHAIN filed contemporaneously with the present application and hereby fully incorporated by reference.

Sample Implementation—Integrated Circuit

Figure 7:
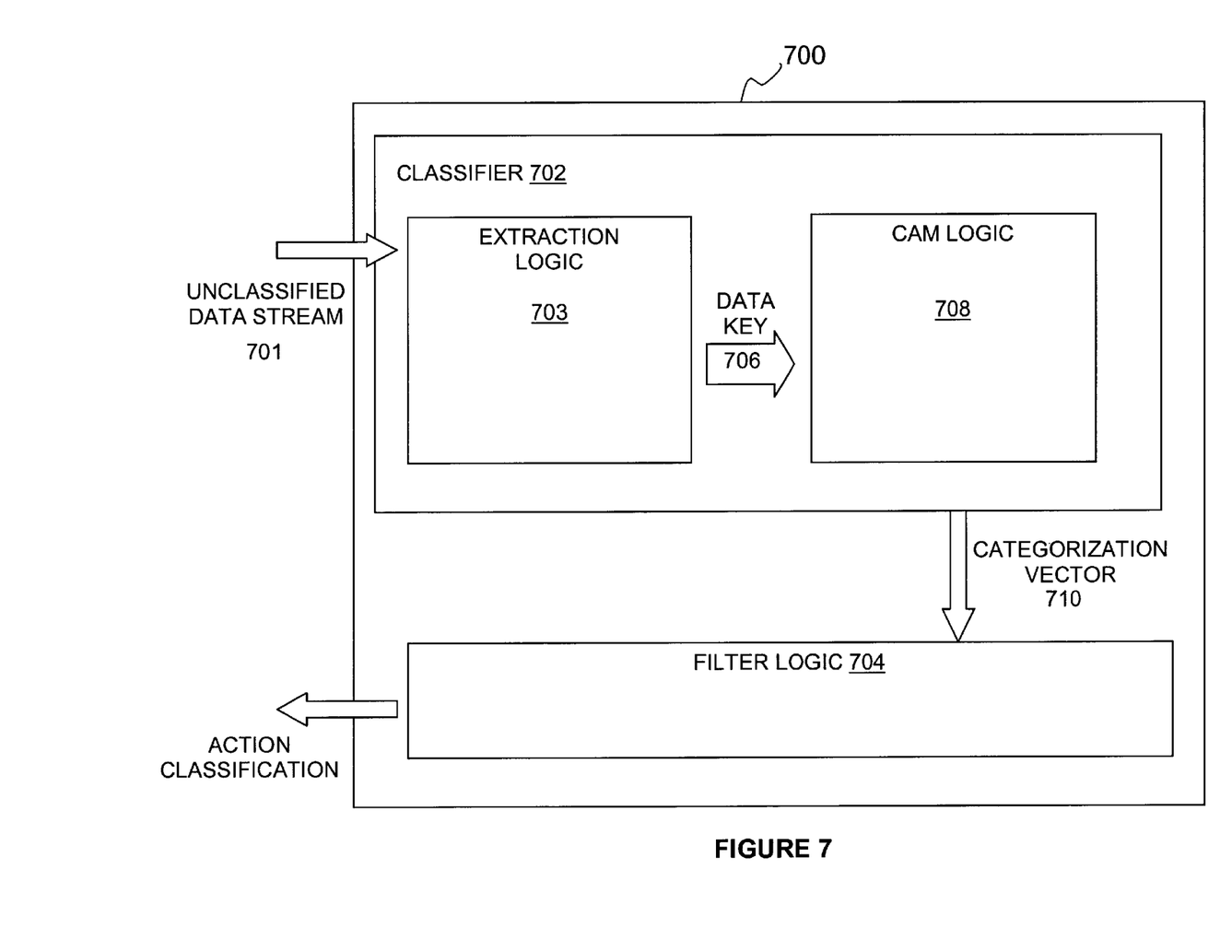
FIG. 7 is a block diagram illustrating one embodiment of an integrated circuit incorporating the teachings of the present invention.

FIG. 7 is a block diagram illustrating an integrated circuit in accordance with one embodiment of the invention. Integrated circuit (IC) 700 includes classifier 702 and filter logic 704. Classifier 702 comprises extraction logic 703 and CAM logic 708 including on chip CAM 714. In accordance with one embodiment of the invention, IC 700 receives unclassified data stream 701 from a source external to IC 700. As described in detail above, extraction logic 703 extracts one or more data keys, such as data key 706, which are input into CAM logic 708 for comparison and classification. If any data key matches a key entry stored within the one or more CAMs included within CAM logic 708, then the matching data key is said to belong to a class of data represented by the CAM containing the matching key entry. Once the data is classified as belonging to a first data class, an associated key tag is identified corresponding to a data subclass. The key tag representing the data subclass is then out put to form at least part of categorization vector 710, which is then sent to filter logic 704. Filter logic 704 performs automatic and programmable combinational logic-based comparisons on the categorization vector to determine the final disposition of the data packets received as part of unclassified data stream 701 based at least in part upon programmed packet filtering rules.

Conclusion and Epilogue

Thus, it can be seen from the above descriptions, a novel method and apparatus for data classification has been described. While the present invention has been described in terms of the above-described embodiments, those skilled in the art will recognize that the invention is not limited to the embodiments described. The present invention can be practiced with modification and alteration within the spirit and scope of the appended claims. Thus, the description is to be regarded as illustrative instead of restrictive on the present invention.

What is claimed is:

1. An apparatus comprising:
   a content addressable memory (CAM) to store key entries corresponding to one or more classes of data represented by the CAM, each of said key entries being associated with one of a plurality of key tags, wherein each key tag corresponds to one of a plurality of subclasses of data; and
   logic to extract a data key from a data stream, to compare at least a portion of the data key with said key entries to determine if the data key matches any of the key entries, and to output one or more key tags associated with matching ones of the key entries to form at least a portion of a categorization vector to facilitate classification of the data stream.

2. The apparatus of claim 1, further comprising a plurality of CAMs to store a plurality of key entries and associated key tags, wherein each of said plurality of CAMs represents a unique one of a plurality of classes of data.

3. The apparatus of claim 2, wherein said logic compares at least a portion of the data key with said plurality of key entries to determine if the data key and said plurality of key entries are equivalent.

4. The apparatus of claim 2, wherein said logic comprises logic to extract a plurality of data keys from a single packet of a data stream.

5. The apparatus of claim 2, wherein output from each of the plurality of CAMs is concatenated together to form a portion of the categorization vector.

6. The apparatus of claim 5, wherein if the data key does not match any of the key entries stored within a given one of the plurality of CAMs, a predetermined bit value is output to form a portion of the categorization vector dedicated to the given one of the plurality of CAMs to indicate such.

7. The apparatus of claim 1, wherein the one or more key tags are concatenated together to form at least the portion of the categorization vector.

8. The apparatus of claim 1, wherein each key tag within the categorization vector corresponds to a unique key entry.

9. A method comprising:
   extracting a data key from a data stream;
   comparing at least a portion of the data key with one or more key entries stored within a first content addressable memory (CAM) representing one or more classes of data to determine if the data key matches any of the key entries, wherein each key entry is associated with one of a plurality of key tags each representing one of a corresponding first plurality of subclasses of data;
   outputting one or more of the plurality of key tags associated with matching ones of the key entries to form at least a first portion of a categorization vector; and
   classifying the data stream based at least in part upon the categorization vector.

10. The method of claim 9, wherein extracting the data key comprises extracting at least one bit of data from a data packet of the data stream.

11. The method of claim 9, further comprising:
    comparing at least a portion of the data key with one or more key entries stored within a second CAM representing a second class of data, wherein each key entry stored within the second CAM is associated with one of a second plurality of key tags each representing one of a corresponding second plurality of subclasses of data.

12. The method of claim 11, wherein if the data key matches one or more key entries stored within the first or second CAMs, a corresponding one or more of said first or second plurality of key tags are output to further form at least part of the categorization vector.

13. The method of claim 9, wherein each of said plurality of key tags comprises a binary representation of $2^N$ subclasses of data.

14. An integrated circuit comprising:
    a plurality of content addressable memories (CAMs), each associated with one of a plurality of data classes and equipped to store one or more of a plurality of key entries and one or more of a plurality of key tags associated with said plurality of key entries, each of said plurality of key entries representing one of said plurality of data classes and each of said key tags representing one of a plurality of data subclasses; and
    logic coupled to the plurality of CAMs to extract a data key from a data stream, to compare at least a portion of the date key with said plurality of key entries to determine if the data key matches any of said plurality of key entries, and to output one or more key tags associated with matching ones of the key entries to format least a portion of a categorization vector to facilitate classification of the data stream.

15. The integrated circuit of claim 14, wherein each of said plurality of CAMs represents a unique one of said plurality of data classes.

16. The integrated circuit of claim 14, wherein said logic comprises logic to extract a plurality of data keys from a single packet of a data stream.

17. The integrated circuit of claim 16, wherein at least one of said plurality of data keys is classified as belonging to a first data subclass of a first of said plurality of CAMs, and a second data subclass of a second of said plurality of CAMs.

18. The integrated circuit of claim 14, further comprising at least one programmable nybble-wide mask coupled to the plurality of CAMs to mask at least part of said data key.

19. An apparatus comprising:
    a first CAM to store a first plurality of key entries and an associated first plurality of key tags;
    a second CAM to store a second plurality of key entries and an associated second plurality of key tags;
    logic to extract a data key from a data stream, to compare at least a portion of the data key against the first and second pluralities of key entries in the first and second CAMs to determine if the data key matches any of the first and second pluralities of key entries, logic to output one or more of the first plurality of key tags from the first CAM, to form a first portion of a categorization vector designed to facilitate classification of the data stream, upon the data key matching a corresponding one or more of the first plurality of key entries; and logic to output one or more of the second plurality of key tags from the second CAM to form a second portion of the categorization vector upon the data key matching a corresponding one or more of the second plurality of key entries.

20. The apparatus of claim 19, wherein the categorization vector comprises a plurality of binary representations concatenated together.

21. The apparatus of claim 20, wherein each of the plurality of binary representations corresponds to a predetermined bit location representing one of the first and second CAMs.

* * * * *